United States Patent [19]

Leong et al.

[11] Patent Number: 5,592,106
[45] Date of Patent: Jan. 7, 1997

[54] PROGRAMMABLE LOGIC ARRAY INTEGRATED CIRCUITS WITH INTERCONNECTION CONDUCTORS OF OVERLAPPING EXTENT

[75] Inventors: William Leong, San Francisco; Cameron McClintock, Mountain View; Richard G. Cliff, Milpitas, all of Calif.

[73] Assignee: Altera Corporation, San Jose, Calif.

[21] Appl. No.: 442,796

[22] Filed: May 17, 1995

[51] Int. Cl.⁶ .................................................. H03K 19/177
[52] U.S. Cl. .................................................. 326/41; 326/39
[58] Field of Search .................................. 326/37, 39, 41, 326/47

[56] References Cited

U.S. PATENT DOCUMENTS

| | | |
|---|---|---|
| Re. 34,363 | 8/1993 | Freeman . |
| 3,473,160 | 10/1969 | Wahlstrom ..................... 340/172.5 |
| 4,609,986 | 9/1986 | Hartmann et al. .............. 364/200 |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. .............. 364/900 |
| 4,758,745 | 7/1988 | Elgamal et al. . |
| 4,774,421 | 9/1988 | Hartmann et al. . |
| 4,786,904 | 11/1988 | Graham, III et al. ............ 326/41 |
| 4,871,930 | 10/1989 | Wong et al. . |
| 4,899,067 | 2/1990 | So et al. . |
| 4,912,342 | 3/1990 | Wong et al. . |
| 5,073,729 | 12/1991 | Greene et al. ................... 326/41 |
| 5,121,006 | 6/1992 | Pedersen . |
| 5,208,491 | 5/1993 | Ebeling et al. ................. 326/39 |
| 5,220,213 | 6/1993 | Chan et al. ..................... 326/41 |
| 5,220,214 | 6/1993 | Pedersen . |
| 5,260,610 | 11/1993 | Pedersen et al. . |
| 5,260,611 | 11/1993 | Cliff et al. . |
| 5,274,581 | 12/1993 | Cliff et al. ..................... 364/784 |
| 5,350,954 | 9/1994 | Patel . |
| 5,371,422 | 12/1994 | Patel et al. ..................... 326/41 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El-Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Edward P. Westin
*Assistant Examiner*—Jon Santamauro
*Attorney, Agent, or Firm*—Fish & Neave; Robert R. Jackson

[57] ABSTRACT

A programmable logic array integrated circuit device has a plurality of programmable logic regions arranged in a two-dimensional array of intersecting rows and columns. Associated with each logic region in each row is a local feedback conductor that spans a unique plurality of other logic regions in the row. Each such local feedback conductor makes the output of the associated logic region available as a possible input to any of the logic regions spanned by that conductor. Each logic region also has several associated intermediary conductors for making the signals on longer leads (such as row-long leads) available as possible inputs to any of the logic regions spanned by the intermediary conductors. At least some of the intermediary conductors associated with each logic region span different groups of logic regions.

24 Claims, 4 Drawing Sheets

PROGRAMMABLE LOGIC ARRAY INTEGRATED CIRCUITS WITH INTERCONNECTION CONDUCTORS OF OVERLAPPING EXTENT

BACKGROUND OF THE INVENTION

This invention relates to programmable logic array integrated circuits, and more particularly to improved organizations of the logic regions and interconnection conductors of such devices.

Several different "architectures" for programmable logic array devices are known. Pedersen et al. U.S. Pat. No. 5,260,610, for example, shows programmable logic array devices in which blocks of programmable logic regions are disposed on the device in a two-dimensional array of intersecting rows and columns of such blocks. Each block includes a plurality of logic regions and a plurality of local feedback conductors for making the output of each logic region in the block selectively available as an input to any logic region in that block. Global horizontal conductors are associated with each row of blocks for conveying signals between the blocks in that row. Global vertical conductors are associated with each column of blocks for conveying signals from row to row.

The Pedersen et al. architecture has many advantages such as relatively high-speed signal conduction due to the continuous, long, global horizontal and vertical conductors. In some applications, however, this architecture may have certain disadvantages. Grouping logic regions into discrete blocks means that a long global conductor must be used whenever a connection is required between logic regions that are not in the same block. Even if the logic regions requiring interconnection are in immediately adjacent blocks, a global conductor (which is much longer than the required interconnection) must be used to make the interconnection. This is wasteful of interconnection resources.

Another possible disadvantage of the Pedersen et al. architecture may be that each global horizontal conductor has many switchable taps along its length because the logic region inputs are fed directly from the global horizontal conductors. These taps can cause significant loading of the global horizontal conductor circuits, which may tend to increase the power required to drive those circuits, and which may also tend to make those circuits not as fast as they would be with fewer programmable taps.

An architecture which addresses some of the possible disadvantages of the Pedersen et al. architecture is shown in Cliff et al. U.S. Pat. No. 5,260,611. The Cliff et al. architecture reduces the number of switchable taps on the global horizontal conductors by tapping those conductors to block input conductors associated with each block, the number of taps to the block input conductors and the number of block input conductors associated with each block being less than the total number of inputs to the logic regions in the block. Each block input conductor is programmably selectively connectable to any logic region in the block.

While the Cliff et al. architecture offers some possible improvements over the Pedersen et al. architecture, it does not improve on the Pedersen et al. architecture in other respects. The Cliff et al. architecture still requires an entire global horizontal or vertical conductor to be used for even relatively short interconnections between blocks. Moreover, if a global horizontal conductor must feed logic regions that happen to be in two adjacent blocks, two block input conductors (one in each of the two adjacent blocks) must be used to get that signal into the two blocks.

A different type of architecture is shown in Freeman U.S. Pat. No. Reissue 34,363. In this architecture short interconnection conductors adjacent to each logic region are programmably interconnectable to one another to make interconnections between any but the most closely adjacent logic regions. A possible disadvantage of this architecture is that large numbers of short conductor segments must be "pieced together" to make long interconnections, which tend to be relatively slow due to the large number of programmable switches that the interconnection signal must pass through. More recent commercial products of Freeman's assignee, Xilinx, Inc., have added longer, uninterrupted conductors, and also uninterrupted conductors between adjacent logic regions (see, for example, Carter U.S. Pat. No. 4,642,487). However, these products still rely heavily on piecing together many relatively short interconnection conductors to make certain kinds of interconnections.

An architecture which relies on piecing together different numbers of interconnection conductors to produce interconnections of different lengths greatly exacerbates the problem of longer signal paths having greater signal transmission delays. This is so because in such architectures longer interconnections tend to be made up of more pieced together segments than shorter interconnections, and each such piecing together adds significant signal transmission delay. Different transmission times for different signal paths make it more difficult to maintain synchronization among various signals and may necessitate designing the chip to operate at a slower overall speed. In other words, the speed of the slowest signal transmission path may dictate the design speed of the overall chip.

Other architectures which rely heavily on piecing together many relatively short conductor segments are shown in Elgamal et al. U.S. Pat. No. 4,758,745, El Gamal et al., "An Architecture for Electrically Configurable Gate Arrays"IEEE Journal of Solid-State Circuits, Vol. 24, No. 2, pp. 394–98, April 1989, and El-Ayat et al., "A CMOS Electrically Configurable Gate Array"IEEE Journal of Solid-State Circuits, Vol. 24, No. 3, pp. 752–62, June 1989. The devices shown in these references are programmable one time only (i.e., they are not reprogrammable).

Although the present invention is applicable to both one-time-programmable and reprogrammable devices, the invention is especially beneficial in connection with reprogrammable devices. Reprogrammable connections tend to be larger (e.g., than the one-time-programmable anti-fuses shown in the above-mentioned Elgamal et al. patent ). This increases signal delay and circuit loading associated with reprogrammable connections. The larger size of reprogrammable connections also makes it important to reduce the number of these connections that are used. For example, if all interconnection regions in an integrated circuit device are fully populated with reprogrammable connections (i.e., if every input to each such interconnection region is connectable to every output of that region), the device tends to become too large. For all of these reasons, reprogrammability strongly pushes the design in the direction of economizing on the number of reprogrammable interconnections that are provided. As interconnection regions are made only partly populated in response to this pressure, it becomes even more important to use sophisticated techniques to ensure maximum routability of signals through the device (i.e., to provide interconnection resources with maximum flexibility and usability so that the maximum number of different interconnection patterns that are possible with signal blockage not occurring prematurely or significantly before substantially all logic regions of the device have been put to use). Thus, while the goals of this invention are of interest regardless of the technology used to implement the integrated circuit device, considerations such as the larger size, loading, and delay of typical reprogrammable interconnection elements makes the invention especially important in connection with reprogrammable devices.

In view of the foregoing, it is an object of this invention to provide improved organizations for the logic regions and interconnection conductors of programmable logic array integrated circuit devices.

It is another object of this invention to provide more options for making connections to and/or interconnections between relatively closely adjacent logic regions so as to make more efficient use of the conductors that make such connections and/or to reduce the need to use relatively long global conductors to make such interconnections, but without resorting to the undesirable expedient of piecing together many relatively short conductors when longer interconnection are required.

SUMMARY OF THE INVENTION

These and other objects of the invention are accomplished in accordance with the principles of the invention by providing programmable logic array integrated circuit devices in which each logic region has a local feedback conductor for making the output of that logic region available as an input to a substantially unique plurality of other adjacent logic regions. For example, the local feedback conductor of each logic region may distribute the output of the logic region to four other logic regions on each side of the logic region. The logic regions are therefore not grouped in discrete blocks by the local feedback conductors, thereby reducing the need to use long global conductors to make connections between nearby logic regions. Adjacent local feedback conductors cannot be "pieced together" to make longer interconnections. They are usable only for local feedback.

If desired, conductors serving as intermediaries between longer conductors (e.g., so-called global horizontal conductors) and the logic regions (similar to the block input conductors in the above-mentioned Cliff et al. architecture) may each also feed different but partly overlapping pluralities of adjacent logic regions. This avoids having all of these intermediary conductors feeding different, completely separate blocks of logic regions, which can necessitate the use of two intermediary conductors to supply a signal to logic regions in adjacent blocks. Instead, by having the intermediary conductors feed different but partly overlapping pluralities of logic regions, it is more often possible to select a single intermediary conductor to supply a signal to several logic regions. This makes more efficient use of the intermediary conductor resource. Again, adjacent intermediary conductors cannot be "pieced together" to make longer interconnections. The above-mentioned longer conductors (e.g., the above-mentioned global horizontal conductors or global vertical conductors) are the resource for making longer interconnections. These longer conductors are continuous or at least substantially continuous and are not made by piecing together multiple axially aligned conductor segments. The length of each of these longer conductors is preferably fixed and not variable because there is no circuitry for optionally connecting axially aligned conductor segments together.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
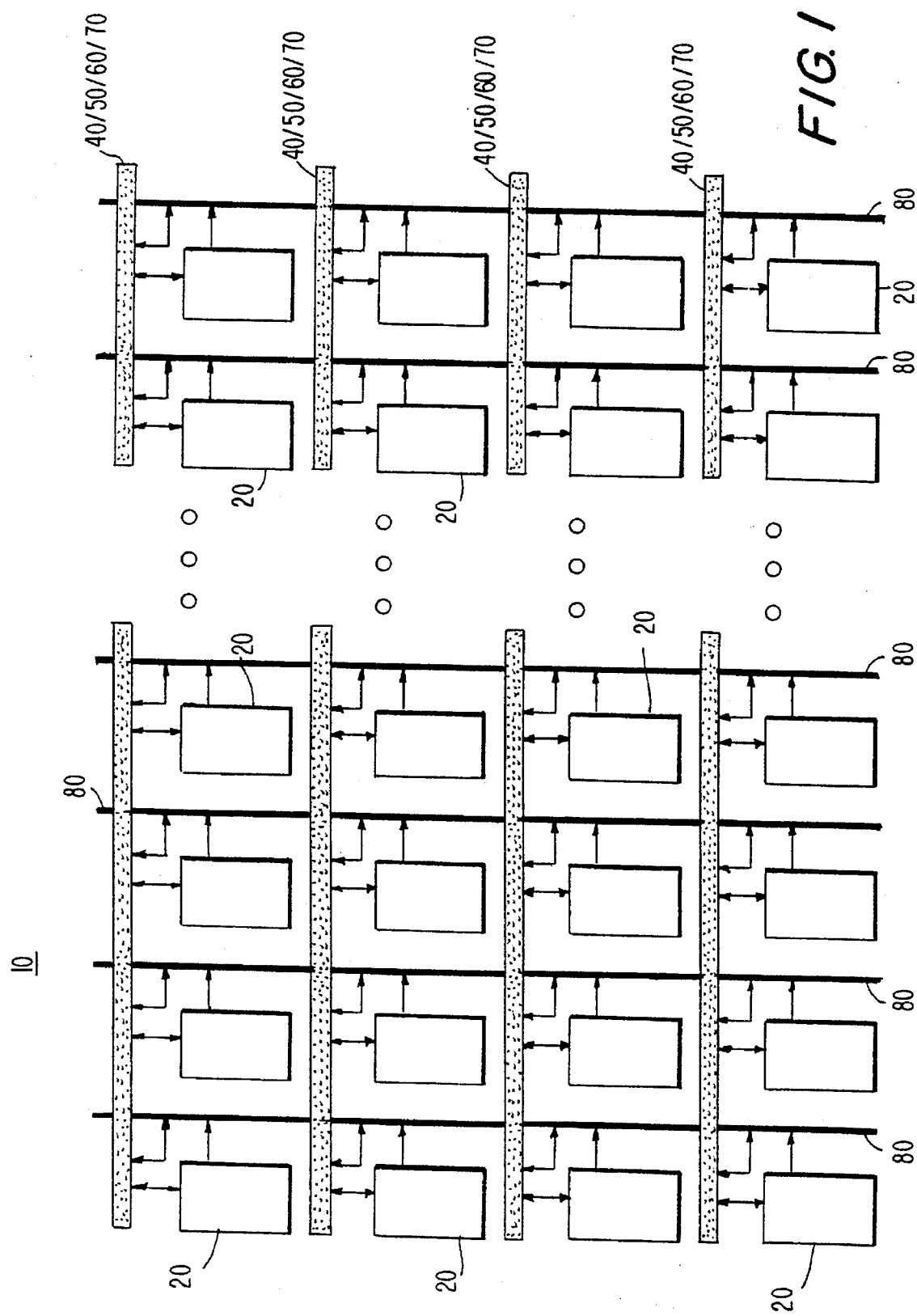
FIG. 1 is a simplified block diagram of a portion of an illustrative programmable logic array integrated circuit constructed in accordance with this invention.

As shown in FIG. 1, an illustrative programmable logic array integrated circuit device 10 constructed in accordance with this invention includes 256 regions 20 of programmable logic arranged in four rows of 64 logic regions each. Logic regions 20 thus form a two-dimensional array of intersecting rows and columns on device 10.

Figure 2:
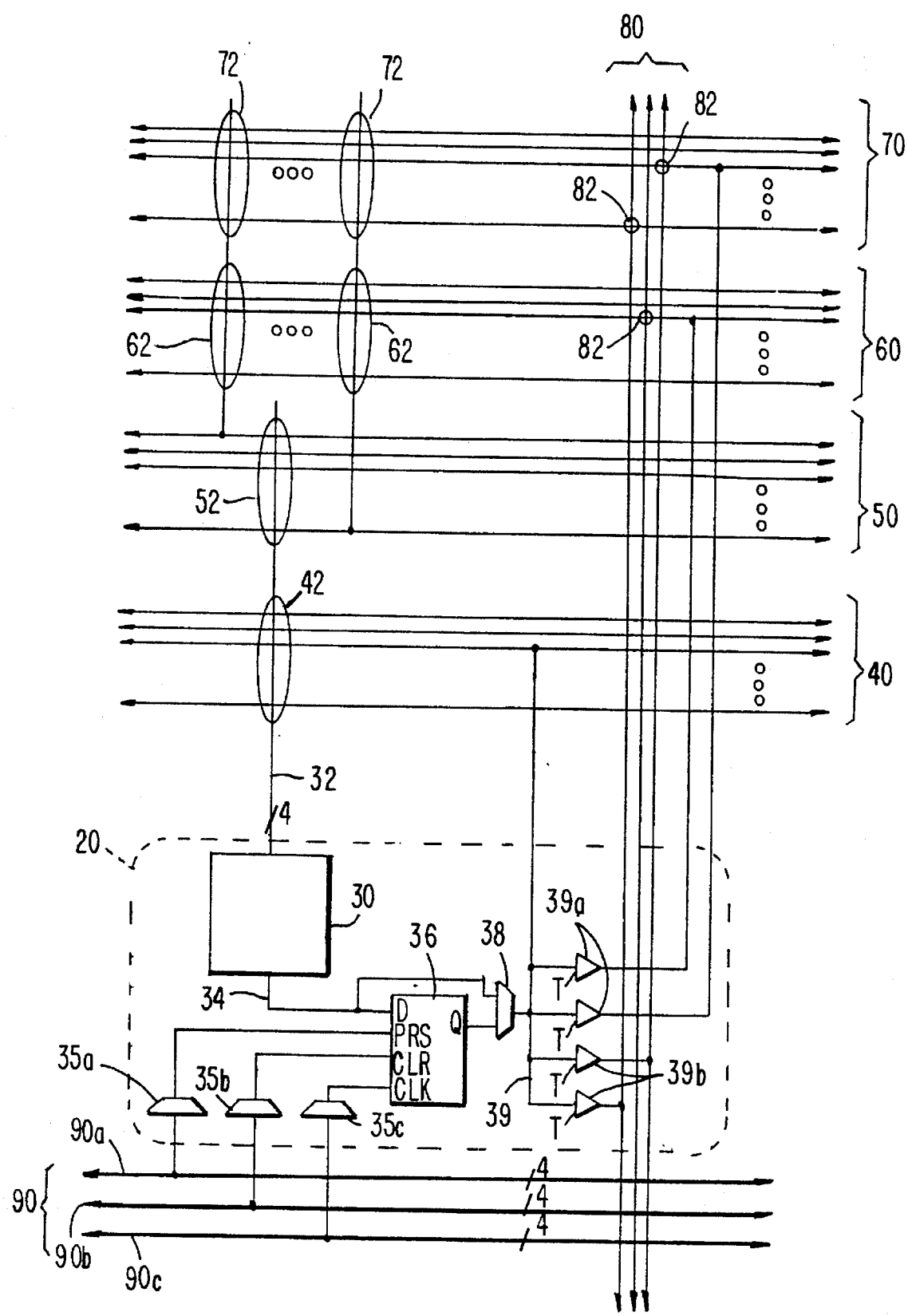
FIG. 2 is a more detailed, but still simplified, schematic block diagram of a representative portion of the apparatus shown in FIG. 1.

A representative one of logic regions 20 is shown in more detail in FIG. 2. As shown there, each logic region 20 includes a four-input universal logic block ("ULB") 30 (e.g., a four-input look-up table) which can be programmed to produce as its output 34 any of several logical combinations of its four inputs 32. ULB output 34 can be registered by data register or flip-flop 36, or it can bypass the flip-flop, depending on which of the two inputs of programmable logic connector ("PLC") 38 that PLC is programmed to pass to its output. (In the depicted preferred embodiment PLC 38 is a switch or multiplexer.) The output 39 of PLC 38 drives one of nine local feedback conductors 40 adjacent to the logic region. The output 39 of PLC 38 may also drive one of half-length horizontal conductors 60 and/or one of global horizontal conductors 70 adjacent to the logic region, depending on the states of programmable tri-state drivers 39a (which are a form of PLC). The output 39 of PLC 38 may also drive either or both of two global vertical conductors 80 adjacent to the logic region, depending on the states of programmable tri-state drivers 39b (which are again a form of PLC). PLCs 35a can select one of four preset signals on conductors 90a for application to the preset input terminal of flip-flop 36. Similarly, PLCs 35b can select one of four clear signals on conductors 90b for application to the clear input terminal of flip-flop 36. And PLCs 35c can select one of four clock signals on conductors 90c for application to the clock input terminal of flip-flop 36.

Although a particular construction of representative logic region 20 is shown in FIG. 2 for purposes of illustration, it will be understood that many other types of logic regions can be used instead if desired. For example, the logic regions may include specialized circuitry to facilitate the performance of arithmetic and/or counter functions associated with some or all of the look-up table inputs. An example of this type of logic region is shown in Cliff et al. U.S. Pat. No. 5,274,581. As another example of possible modifications, logic regions 20 could alternatively be implemented as product-term-based macrocells. Similarly, PLCs 35 and 38 (and other PLCs used throughout device 10) can be implemented in any of many different ways. For example, each PLC can be a relatively simple programmable connector such as a switch or a plurality of switches for connecting an input or any one of several inputs to an output. Or each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Because the connection capabilities of PLCs tend to be of basic importance in relation to the present invention, these devices will sometimes be referred to herein as switches or the like, even though it will be understood that in some embodiments the PLCs may additionally perform logic as has been explained. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not separately shown in the drawings. (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. Any of these various technologies can also be used for the programmable memories of ULBs 30. Thus it will be seen that this invention is applicable to both reprogrammable and one-time-only programmable devices. However, the invention is especially advantageous in the case of reprogrammable devices because (as noted in the background section of this specification) those devices tend to benefit more from economies in interconnection resources. Thus the most preferred embodiments of this invention are reprogrammable.

Returning to FIG. 1, a plurality of horizontal conductors 40/50/60/70 is associated with each row of logic regions 20. A plurality of vertical conductors 80 is associated with each column of logic regions 20.

Figure 3:
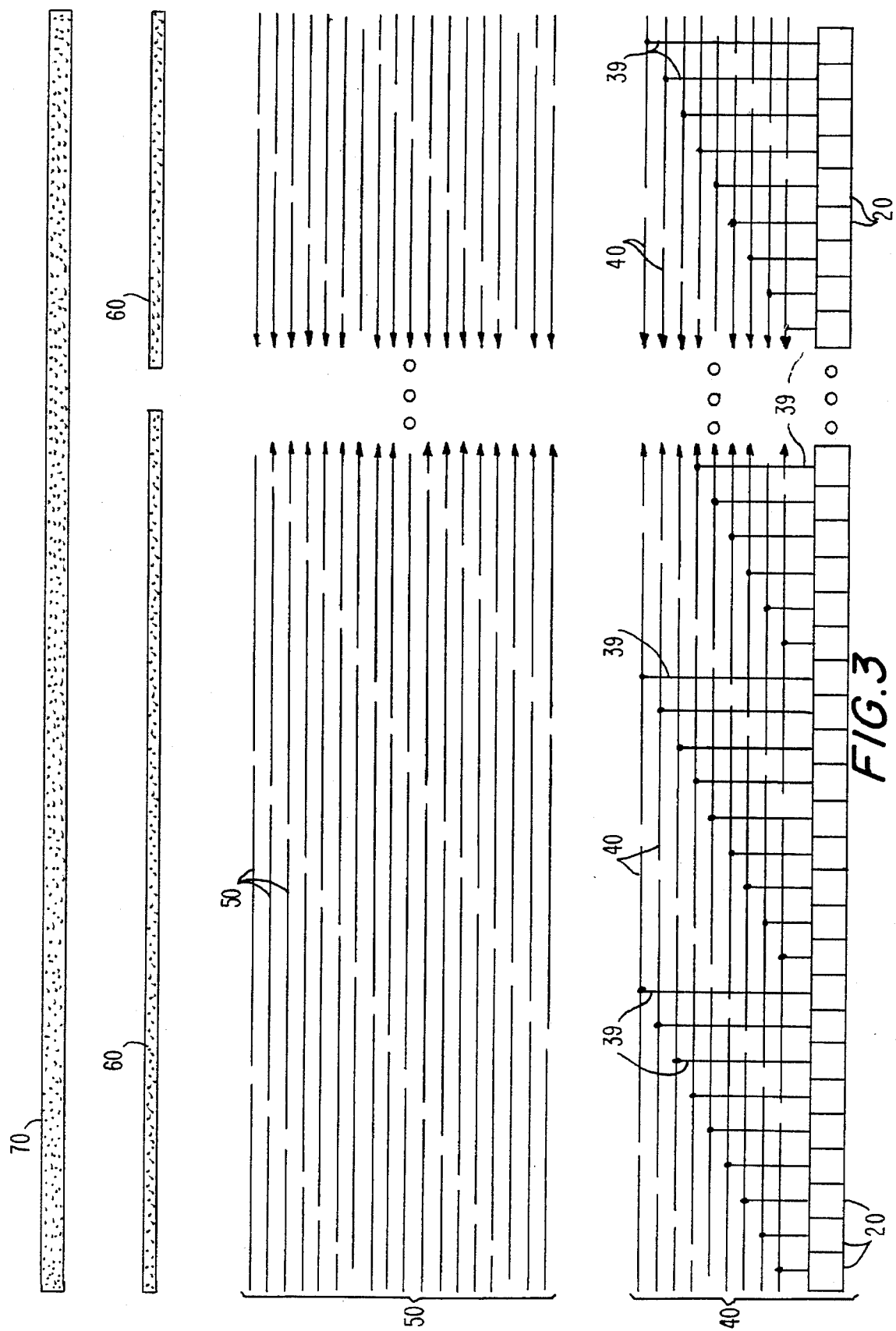
FIG. 3 is another more detailed, but still simplified, block diagram of a representative portion of the apparatus shown in FIG. 1.

The organization of the horizontal conductors associated with each row of logic regions is shown in more detail in FIG. 3. There are nine local feedback channels 40 adjacent to each row. Each such channel includes several axially aligned local feedback conductors (also identified by the reference number 40). In general, each local feedback conductor 40 spans nine horizontally adjacent logic regions 20. (At the ends of the rows there are some conductors 40 that are shorter than normal, as can be seen at the extreme left and extreme right in FIG. 3.) In general, each conductor 40 receives the output signal 39 of the logic region 20 which is at the center of the nine logic regions spanned by that conductor. (Again, at the ends of the rows this pattern is somewhat altered.) Each conductor 40 makes the signal on that conductor available as a possible input to any of the logic regions 20 spanned by that conductor (see FIG. 2). Conductors 40 are therefore usable to feed the output of each logic region 20 back to any or all of several closely adjacent logic regions. Axially aligned and adjacent conductors 40 are preferably not directly connectable to one another. In other words, there is preferably no circuitry between axially aligned and adjacent conductors 40 for interconnecting those conductors and thereby "piecing together" two or more such conductors to make a longer Conductor. This characteristic of conductors 40 (and other conductors with the same characteristic) is sometimes referred to herein by saying that each of these conductors is "separate" from all other similar conductors.

It will be appreciated from the foregoing that each conductor 40 spans a unique plurality of logic regions 20. These pluralities partly overlap as one progresses from left to right (or from right to left) along a row. The logic regions are therefore not grouped into discrete groups or blocks by the local feedback conductors, as is true in the Pedersen et al. and Cliff et al. architectures described above. This reduces the need to use the longer conductors such as 60 and 70 (described in more detail below) to make connections between nearby logic regions.

Continuing with FIG. 3, the horizontal conductors adjacent to each row of logic regions 20 also include 20 channels of intermediary conductors 50. Not quite all of these 20 channels are shown in FIG. 3, but enough channels are shown to clearly reveal how these channels are used. Each intermediary conductor 50 is programmably connectable to one of a predetermined sub-plurality of conductors 60 and 70. This is shown in FIG. 2 where ellipses 62 and 72 represent preferably partially populated input connections to PLCs that select which of several conductors 60 and 70 will supply the signal on each of intermediary conductors 50. Ellipses 52 and 42 in turn represent preferably fully populated input connections to PLCs that select which of conductors 50 and 40 will supply the signal on each input 32 to representative logic region 20. Thus only certain ones of conductors 60 and 70 can get to any particular one of conductors 50 in the depicted preferred embodiment. But each of the conductors 40 and 50 adjacent to each logic region 20 is connectable to any of the four inputs 32 to that logic region in the depicted preferred embodiment.

In general, the horizontal span of each intermediary conductor 50 is similar to the horizontal span of a local feedback conductor 40. Thus the typical conductor 50 spans nine horizontally adjacent logic regions 20. (This number is less for conductors 50 at the ends of the rows, as can be seen at the extreme left and extreme right in FIG. 3.) Although there is some duplication (i.e., because most groups of nine logic regions have two or three co-extensive conductors 50), there is also extensive overlapping among the groups of logic regions served by the various conductors 50. Thus any group of nine horizontally adjacent logic regions 20 has two or three conductors 50 that are co-extensive with that group. Only one conductor 50 is therefore generally needed to supply a signal from conductors 60 or 70 to logic regions that are no farther apart than the nine-region span (typical) of conductors 50. In the above-described Cliff et al. architecture it is often necessary to use two block feeding conductors for this kind of communication because the logic regions to be fed are in adjacent discrete blocks. In the present architecture there is extensive overlapping of groups of logic regions rather than grouping of logic regions into mutually exclusive and therefore discrete blocks.

As in the case of conductors 40, axially aligned and adjacent conductors 50 are preferably not directly connectable to one another. In other words, there is preferably no circuitry between axially aligned and adjacent conductors 50 for allowing those conductors to be optionally interconnected and thereby "pieced together" to make a longer conductor. Each of conductors 50 is therefore preferably separate from all other conductors 50, as the term "separate" has been defined herein.

Continuing further with FIG. 3, the horizontal conductors adjacent to each row of logic regions 20 also include 16 channels of half-length horizontal conductors 60 and 32 global horizontal conductors 70. Each half-length conductor 60 spans either the 32 left-most or 32 right-most logic regions 20 in the associated row. Thus there is a total of 32 half-length conductors 60—16 on the left and 16 on the right. Each global horizontal conductor 70 spans the entire 64 logic regions 20 in the associated row. As mentioned above in relation to FIG. 2, the output 39 of each logic region can drive one adjacent conductor 60 and/or one adjacent conductor 70. These possible inputs to conductors 60 and 70 are distributed uniformly over conductors 60 and 70 so that each such conductor has two possible inputs from the logic regions. As in the case of conductors 40 and 50, axially aligned and adjacent conductors 60 are preferably not directly connectable to one another. Each conductor 60 is therefore preferably separate from all other conductors 60, as the term "separate" has been defined herein. Each conductor 60 is preferably continuous or substantially continuous along its length and is not optionally extendable by connecting it to another axially aligned conductor 60. Each conductor 70 is also preferably continuous or substantially continuous along its length.

The rows of logic regions 20 communicate with each other via global vertical conductors 80, which are again preferably continuous or substantially continuous along their length. There are three such conductors 80 adjacent to and associated with each vertical column of logic regions 20. As mentioned above, each logic region in a column can drive two of the three adjacent conductors 80. These possible inputs to conductors 80 are distributed approximately evenly over the conductors associated with each column so that each conductor has two or three such possible inputs.

Each conductor 80 is programmably, bi-directionally connectable to either a conductor 60 or a conductor 70 associated with each row of logic regions. These connections are distributed uniformly over conductors 60 and 70 so that each conductor 60 and 70 has two such possible connections to and from conductors 80. The PLCs which make these connections are represented by circles 82 in FIG. 2.

Communication to and from input/output ("I/O") pads along the left and right sides of chip 10 is via PLCs and/or tri-state drivers (which are a form of PLC) between those pads and conductors 60 and 70. This circuitry is not shown herein, but it may be as shown in FIGS. 6a and 6b of Cliff et al. U.S. Pat. No. 5,260,611. Similarly, communication to and from I/O pads along the top and bottom of the chip is via PLCs and/or tri-state drivers between those pads and conductors 80. Again, this circuitry is not shown herein, but it may be like that shown in FIGS. 6a and 6b of Cliff et al. U.S. Pat. No. 5,260,611.

Figure 4:
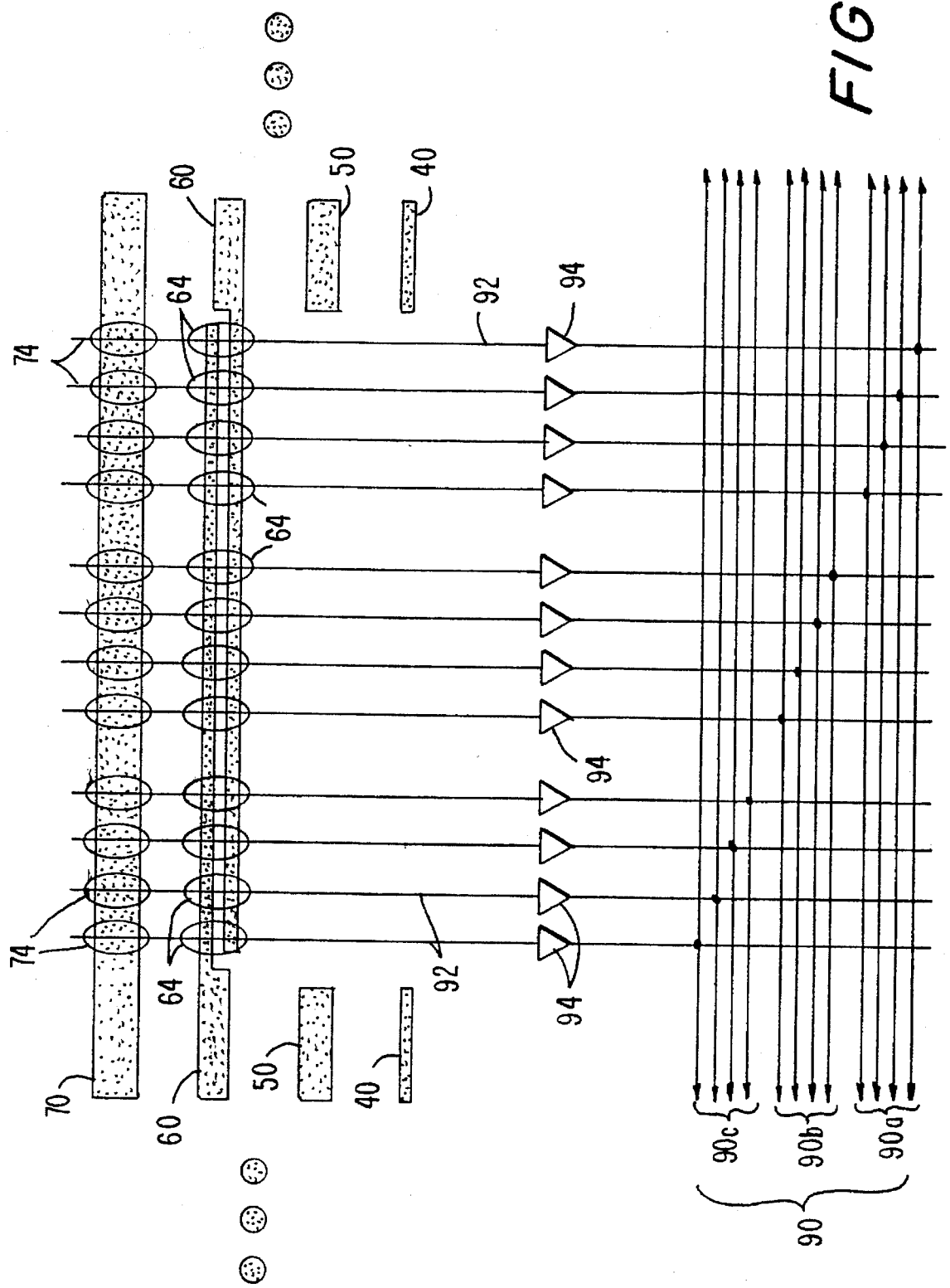
FIG. 4 is still another more detailed, but still simplified, schematic block diagram of a representative portion of the apparatus shown in FIG. 1.

As shown in FIGS. 2 and 4, each row of logic regions 20 has four associated preset signal conductors 90a, four associated clear signal conductors 90b, and four associated clock signal conductors 90c. The signals on the conductors 90 associated with each row can be selectively applied to any of the flip-flop devices 36 in the logic regions in that row as has already been described in connection with FIG. 2. FIG. 4 shows how the signals on the conductors 90 associated with a representative row are derived from the conductors 60 and 70 associated with that row. Half of the conductors 60 in each of the two groups of such conductors are extended for possible connection via PLCs 64 to conductors 90. The inputs to PLCs 64 are partially populated and distributed uniformly over the conductors 60 that are extended for such PLC connections. Conductors 70 also have PLC connections 74 to conductors 90. Again, the inputs to PLCs 74 are partially populated and distributed uniformly over the conductors 70. The outputs 92 of PLCs 64/74 are applied to drivers 94. The output of each driver 94 is connected to a respective one of conductors 90.

It will be understood that the foregoing is only illustrative of the principles of this invention and that various modifications can be made by those skilled in the art without departing from the scope and spirit of the invention. For example, different types of logic regions can be used as has been mentioned. Also different numbers of logic regions can be provided and/or different numbers of rows and/or columns can be employed. Different numbers of each type of conductor are possible, as are different population densities for the various types of PLCs that are used.

The invention claimed is:

1. A programmable logic array integrated circuit device comprising:

a plurality of logic regions disposed on said device in a two-dimensional array of intersecting rows and columns of such logic regions, each logic region being programmable to produce an associated logic region output signal which is any of a plurality of logical functions of a plurality of logic region input signals associated with and applied to said logic region via input terminals of said logic regions;

a plurality of local feedback channels adjacent each said row;

a plurality of local feedback conductors axially aligned in said plurality of local feedback channels, each of said plurality of local feedback conductors being associated with a respective one of said logic regions and receiving the output signal of only the associated logic region, each of said local feedback conductors spanning a substantially unique group of logic regions adjacent to said associated logic region, each said group of logic regions including a plural number of said logic regions;

a first plurality of programmable logic connectors for selectively connecting each of said local feedback conductors to at least one of said input terminals of each of the logic regions spanned by said local feedback conductor;

a plurality of row conductors associated with and extending along each of said rows;

a plurality of column conductors associated with and extending along each of said columns;

a plurality of intermediary conductors, each of which is selectively connectable to any of an associated subplurality of said row conductors and each of which spans an associated subplurality of adjacent ones of said logic regions, each logic region being included in a multiplicity of said subpluralities of logic regions, at least some of said subpluralities of logic regions in each multiplicity including at least some different ones of said logic regions than others of said subpluralities in said multiplicity include;

a second plurality of programmable logic connectors for selectively connecting each of said intermediary conductors to at least one of said input terminals of each of the logic regions spanned by said intermediary conductors;

a third plurality of programmable logic connectors for selectively connecting the output signal of each logic region to some row and column conductors adjacent to said logic region; and a fourth plurality of programmable logic connectors for selectively interconnecting said row and column conductors.

2. A programmable logic array integrated circuit device comprising:

a plurality of logic regions disposed on said device in a two-dimensional array of intersecting rows and columns of such logic regions, each logic region being programmable to produce an associated logic region output signal which is any of a plurality of logical functions of a plurality of logic region input signals associated with and applied to said logic region via input terminals of said logic regions;

a plurality of local feedback conductors, each of which is associated with a respective one of said logic regions and each of which receives the output signal of the associated logic region, each of said local feedback conductors spanning a substantially unique group of logic regions adjacent to said associated logic region, wherein the group of logic regions spanned by each of said local feedback conductors includes the logic region with which said local feedback conductor is associated;

a first plurality of programmable logic connectors for selectively connecting each of said local feedback conductors to at least one of said input terminals of each of the logic regions spanned by said local feedback conductor;

a plurality of row conductors associated with and extending along each of said rows;

a plurality of column conductors associated with and extending along each of said columns;

a plurality of intermediary conductors, each of which is selectively connectable to any of an associated subplurality of said row conductors and each of which spans an associated subplurality of adjacent ones of said logic regions, each logic region being included in a multiplicity of said subpluralities of logic regions, at least some of said subpluralities of logic regions in each multiplicity including at least some different ones of said logic regions than others of said subpluralities in said multiplicity include;

a second plurality of programmable logic connectors for selectively connecting each of said intermediary conductors to at least one of said input terminals of each of the logic regions spanned by said intermediary conductors;

a third plurality of programmable logic connectors for selectively connecting the output signal of each logic region to row and column conductors adjacent to said logic region; and a fourth plurality of programmable logic connectors for selectively interconnecting said row and column conductors.

3. A programmable logic array integrated circuit device comprising:

a plurality of logic regions disposed on said device in a two-dimensional array of intersecting rows and columns of such logic regions, each logic region being programmable to produce an associated logic region output signal which is any of a plurality of logical functions of a plurality of logic region input signals associated with and applied to said logic region via input terminals of said logic regions;

a plurality of local feedback conductors, each of which is associated with a respective one of said logic regions and each of which receives the output signal of the associated logic region, each of said local feedback conductors spanning a substantially unique group of logic regions adjacent to said associated logic region, wherein the logic regions in each of said groups are in a row of said logic regions which includes the logic region with which the feedback conductor spanning said group is associated;

a first plurality of programmable logic connectors for selectively connecting each of said local feedback conductors to at least one of said input terminals of each of the logic regions spanned by said local feedback conductor;

a plurality of row conductors associated with and extending along each of said rows;

a plurality of column conductors associated with and extending along each of said columns;

a plurality of intermediary conductors, each of which is selectively connectable to any of an associated subplurality of said row conductors and each of which spans an associated subplurality of adjacent ones of said logic regions, each logic region being included in a multiplicity of said subpluralities of logic regions, at least some of said subpluralities of logic regions in each multiplicity including at least some different ones of said logic regions than others of said subpluralities in said multiplicity include;

a second plurality of programmable logic connectors for selectively connecting each of said intermediary conductors to at least one of said input terminals of each of the logic regions spanned by said intermediary conductors;

a third plurality of programmable logic connectors for selectively connecting the output signal of each logic region to row and column conductors adjacent to said logic region; and a fourth plurality of programmable logic connectors for selectively interconnecting said row and column conductors.

4. The apparatus defined in claim 1 wherein each of said groups of logic regions includes approximately eight logic regions adjacent to the logic region with which the feedback conductor spanning said group is associated.

5. A programmable logic array integrated circuit device comprising:

a plurality of logic regions disposed on said device in a two-dimensional array of intersecting rows and columns of such logic regions, each logic region being programmable to produce an associated logic region output signal which is any of a plurality of logical functions of a plurality of logic region input signals associated with and applied to said logic region via input terminals of said logic regions;

a plurality of local feedback conductors, each of which is associated with a respective one of said logic regions and each of which receives the output signal of the associated logic region, each of said local feedback conductors spanning a substantially unique group of logic regions adjacent to said associated logic region;

a first plurality of programmable logic connectors for selectively connecting each of said local feedback conductors to each of said input terminals of each of the logic regions spanned by said local feedback conductor;

a plurality of row conductors associated with and extending along each of said rows;

a plurality of column conductors associated with and extending along each of said columns;

a plurality of intermediary conductors, each of which is selectively connectable to any of an associated subplurality of said row conductors and each of which spans an associated subplurality of adjacent ones of said logic regions, each logic region being included in a multiplicity of said subpluralities of logic regions, at least some of said subpluralities of logic regions in each multiplicity including at least some different ones of said logic regions than others of said subpluralities in said multiplicity include;

a second plurality of programmable logic connectors for selectively connecting each of said intermediary conductors to at least one of said input terminals of each of the logic regions spanned by said intermediary conductors;

a third plurality of programmable logic connectors for selectively connecting the output signal of each logic region to row and column conductors adjacent to said logic region; and a fourth plurality of programmable logic connectors for selectively interconnecting said row and column conductors.

6. The apparatus defined in claim 1 wherein said row conductors associated with each of said rows includes:

a plurality of global row conductors, each of which extends along the entire length of the associated row; and a plurality of sub-row conductors, each of which extends along a respective portion of the length of the associated row.

7. The apparatus defined in claim 6 wherein said portions of each row along which the sub-row conductors associated with that row extend are mutually exclusive of one another and collectively exhaustive of the entire length of said row.

8. The apparatus defined in claim 7 wherein each of said sub-row conductors extends along half the length of the associated row.

9. The apparatus defined in claim 6 wherein each portion of each row has the same number of said sub-row conductors extending along it.

10. The apparatus defined in claim 6 wherein the subplurality of said row conductors to which each of said intermediary conductors is selectively connectable includes at least one row conductor and at least one sub-row conductor.

11. The apparatus defined in claim 1 wherein the logic regions in each of said subpluralities of logic regions are in one of said rows.

12. The apparatus defined in claim 1 wherein each of said intermediary conductors is associated with one of said rows and is selectively connectable only to row conductors that are also associated with that row.

13. The apparatus defined in claim 1 wherein each of said intermediary conductors is associated with one of said rows, and wherein the subplurality of said logic regions spanned by said intermediary conductor are in said row with which said intermediary conductor is associated.

14. The apparatus defined in claim 13 wherein each of said subpluralities includes only a fraction of the logic regions in a row.

15. A programmable logic array integrated circuit device comprising:

a plurality of logic regions disposed on said device in a two-dimensional array of intersecting rows and columns of such logic regions, each logic region being programmable to produce an associated logic region output signal which is any of a plurality of logical functions of a plurality of logic region input signals associated with and applied to said logic region via input terminals of said logic regions;

a plurality of local feedback conductors, each of which is associated with a respective one of said logic regions and each of which receives the output signal of the associated logic region, each of said local feedback conductors spanning a substantially unique group of logic regions adjacent to said associated logic region;

a first plurality of programmable logic connectors for selectively connecting each of said local feedback conductors to at least one of said input terminals of each of the logic regions spanned by said local feedback conductor;

a plurality of row conductors associated with and extending along each of said rows;

a plurality of column conductors associated with and extending along each of said columns;

a plurality of intermediary conductors, each of which is selectively connectable to any of an associated subplurality of said row conductors and each of which spans an associated subplurality of adjacent ones of said logic regions, each logic region being included in a multiplicity of said subpluralities of logic regions, at least some of said subpluralities of logic regions in each multiplicity including at least some different ones of said logic regions than others of said subpluralities in said multiplicity include;

a second plurality of programmable logic connectors for selectively connecting each of said intermediary conductors to each of said input terminals of each of the logic regions spanned by said intermediary conductors;

a third plurality of programmable logic connectors for selectively connecting the output signal of each logic region to row and column conductors adjacent to said logic region; and a fourth plurality of programmable logic connectors for selectively interconnecting said row and column conductors.

16. The apparatus defined in claim 1 wherein said third plurality of programmable logic connectors comprises programmably controlled tri-state drivers for selectively applying the output signal of each logic region to row and column conductors adjacent to said logic region.

17. A programmable logic array integrated circuit device comprising:

a plurality of logic regions disposed on said device in a two-dimensional array of intersecting rows and columns of such logic regions, each logic region being programmable to produce an associated logic region output signal which is any of a plurality of logical functions of a plurality of logic region input signals associated with and applied to said logic region via input terminals of said logic regions;

a plurality of local feedback conductors, each of which is associated with a respective one of said logic regions and each of which receives the output signal of the associated logic region, each of said local feedback conductors spanning a substantially unique group of logic regions adjacent to said associated logic region;

a first plurality of programmable logic connectors for selectively connecting each of said local feedback conductors to at least one of said input terminals of each of the logic regions spanned by said local feedback conductor;

a plurality of row conductors associated with and extending along each of said rows;

a plurality of column conductors associated with and extending along each of said columns;

a plurality of intermediary conductors, each of which is selectively connectable to any of an associated subplurality of said row conductors and each of which spans an associated subplurality of adjacent ones of said logic regions, each logic region being included in a multiplicity of said subpluralities of logic regions, at least some of said subpluralities of logic regions in each multiplicity including at least some different ones of said logic regions than others of said subpluralities in said multiplicity include;

a second plurality of programmable logic connectors for selectively connecting each of said intermediary conductors to at least one of said input terminals of each of the logic regions spanned by said intermediary conductors;

a third plurality of programmable logic connectors for selectively connecting the output signal of each logic region to row and column conductors adjacent to said logic region; and a fourth plurality of programmable logic connectors for selectively interconnecting a said row and column conductors, wherein each connector in said fourth plurality of programmable logic connectors selectively makes a bi-directional connection between a row conductor and a column conductor.

18. The apparatus defined in claim 1 wherein each logic region includes a data register for selectively registering the output signal of said logic region, wherein each data register has at least one control input terminal for receiving a control signal selected from the group consisting of clock, clear, and preset control, and wherein said apparatus further comprises a control signal conductor associated with and extending along each of said rows for conveying a control signal to the data register in any of said logic regions in said row.

19. The apparatus defined in claim 18 wherein each of said logic regions further includes a programmable logic connector for selectively applying the control signal on the control signal conductor that conveys said control signal to the data register in said logic region to the control input terminal of the data register in said logic region.

20. The apparatus defined in claim 18 further comprising:

a fifth plurality of programmable logic connectors for selectively connecting any one of at least a subplurality of said row conductors associated with each row to the control signal conductor associated with that row.

21. The apparatus defined in claim 1 wherein each of said local feedback conductors is separate from all others of said local feedback conductors.

22. The apparatus defined in claim 1 wherein each of said intermediary conductors is separate from all others of said intermediary conductors.

23. The apparatus defined in claim 6 wherein each of said sub-row conductors is separate from all others of said sub-row conductors.

24. The apparatus defined in claim 1 wherein said plurality of local feedback channels is substantially equal in number to the number of said logic regions in said group.

* * * * *